United States Patent
Han

(10) Patent No.: US 7,008,869 B2
(45) Date of Patent: Mar. 7, 2006

(54) METHOD FOR FORMING METAL WIRING WITHOUT METAL BYPRODUCTS THAT CREATE BRIDGE BETWEEN METAL WIRES IN A SEMICONDUCTOR DEVICE

(75) Inventor: Seung Hee Han, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/704,895

(22) Filed: Nov. 10, 2003

(65) Prior Publication Data
US 2005/0009323 A1    Jan. 13, 2005

(30) Foreign Application Priority Data
Jul. 9, 2003    (KR) ............... 10-2003-0046339

(51) Int. Cl.
*H01L 21/4763* (2006.01)
(52) U.S. Cl. .............. 438/622; 438/636; 438/688; 438/736
(58) Field of Classification Search ......... 438/734–738
See application file for complete search history.

(56) References Cited

U.S. PATENT DOCUMENTS

| | | | |
|---|---|---|---|
| 5,631,197 A * | 5/1997 | Yu et al. ............ | 438/699 |
| 6,025,273 A | 2/2000 | Chen et al. | |
| 6,159,863 A * | 12/2000 | Chen et al. ........ | 438/720 |
| 6,277,752 B1 | 8/2001 | Chen | |
| 6,306,771 B1 * | 10/2001 | Syau et al. ........ | 438/706 |
| 6,492,276 B1 | 12/2002 | Huang | |
| 6,573,189 B1 * | 6/2003 | Lin et al. .......... | 438/725 |

* cited by examiner

*Primary Examiner*—Jack Chen
(74) *Attorney, Agent, or Firm*—Ladas & Parry LLP

(57) ABSTRACT

A bridge phenomenon between metal wirings is prevented by removing metal by-products created during a metal wiring etching process. A semiconductor substrate is formed with an insulation layer having a conductive plug. A metal layer including first Ti/TiN layer, an Al layer, and a second Ti/TiN layer is formed on an entire surface of the semiconductor substrate. A hard mask layer is formed on the metal layer. A photosensitive film pattern is formed the hard mask layer and the hard mask layer is primarily etched by using the photosensitive film pattern as a mask. The metal layer is etched by using the photosensitive film pattern and the etched hard mask layer as an etching mask.

3 Claims, 4 Drawing Sheets

METHOD FOR FORMING METAL WIRING WITHOUT METAL BYPRODUCTS THAT CREATE BRIDGE BETWEEN METAL WIRES IN A SEMICONDUCTOR DEVICE

BACKGROUND OF THE INVENTION

1. Field of the Invention

The present invention relates to a method for manufacturing a semiconductor device, and more particularly to a method for forming a metal wiring of a semiconductor device capable of preventing metal by-products, which are generated in an area having high pattern density when over-etching time is inefficient due to a lack of a photosensitive film margin during a metal wiring etching process.

2. Description of the Prior Art

As semiconductor devices have been highly integrated, a critical dimension of a metal wiring is reduced so that it is difficult to define a pattern in a photo process. In addition, since the pattern is defined with reducing thickness of a photosensitive film, a margin of the photosensitive film is inefficient when performing an etching process so that it is difficult to determine an etching target. Accordingly, an over-etching time is inefficient, so metal by-products are generated. Thus, a bridge is formed between metal wirings, thereby reducing a yield rate of semiconductor devices.

FIGS. 1a to 1c are sectional views showing a conventional metal wiring forming method.

As shown in FIG. 1a, a lower metal wiring 2 is formed on a semiconductor substrate 1. Then, after forming an insulation layer 3 on an entire surface of the semiconductor substrate 1, the insulation layer 3 is selectively etched so as to form a contact hole 4 exposing a part of the lower metal wiring 2. Then, a tungsten layer (not shown) is deposited on the entire surface of the semiconductor substrate 1 including the contact hole 4 and a mechanical and chemical vapor deposition process is carried out in order to form a conductive plug 9 for filling the contact hole 4.

After that, a metal layer 9 for forming an upper metal wiring and including a first Ti/TiN layer 6, an Al layer 7, and a second Ti/TiN layer 8, which are sequentially deposited, is formed on the entire surface of the semiconductor substrate 1 including the conductive plug 5. At this time, the first and second Ti layers act as an adhesive layer, and the first TiN layer acts as a diffusion barrier. In addition, the Al layer acts as a conductive layer for transferring an electric signal, and the second TiN layer acts as an anti-reflective coating layer for reducing light reflection when patterning the photosensitive film.

Then, as shown in FIG. 1b, after coating the photosensitive film on the metal layer 9, an exposure and development process is carried out so as to form a photosensitive film pattern 20 for exposing an upper metal wiring region (not shown). At this time, the photosensitive film acts as an etching mask when a next etching process is carried out, so it is required for the photosensitive film to have sufficient thickness. As an integration degree of the metal wirings increases, a line width and an interval between metal wirings are reduced and a height of the metal wiring is increased. Thus, the thickness of the photosensitive film coated on the metal layer must be increased in proportion to the height of the metal wiring.

After that, the metal layer is dry-etched by using the photosensitive film pattern 20 as a mask. In addition, as shown in FIG. 1c, an upper metal wiring 10 connected to the lower metal wiring 2 through the conductive plug 5 is formed. When the dry-etching process is carried out, plasma including activated $Cl_2$, $BCl_3$, and $N_2$ gases is used as etching gas. Then, the photosensitive film pattern is removed.

FIG. 2 is a sectional view for explaining problems of a conventional semiconductor manufacturing process.

As an integration degree of the semiconductor device increases, a line width and an interval between metal wirings are reduced and a height of the metal wiring is increased. When fabricating the metal wiring having the high integration degree by using the conventional semiconductor manufacturing process, problems occur as follows:

Firstly, when Al is used as a metal layer for the metal wiring, the metal layer cannot be constantly maintained in a predetermined shape because Al has superior ductility. For this reason, 5% of Cu is mixed with Al when forming the metal layer. However, Cu is not uniformly distributed into the metal layer, but concentrated at an interfacial surface between the metal layer and the first Ti/TiN layer in the form of an $Al_2Cu$ layer.

Thus, when the upper metal wiring is formed by dry-etching the metal layer, the $Al_2Cu$ layer aligned between the first Ti/TiN layer and an Al layer acts as a barrier because the $Al_2Cu$ layer has relatively lower vapor pressure as compared with the Al layer. Accordingly, an activated Cl radical is not easily etched so that metal by-products having a rice shape are created on a surface of the insulation layer (refer to "A" in FIG. 2).

Due to the metal by-products, an etch stop layer is detected before the $Al_2Cu$ layer is etched so that an over-etching is insufficient carried out. Thus, the metal by-products cannot be completely removed, thereby causing a bridge between metal wiring.

In order to solve the above problem, a physical etching process has been suggested instead of a chemical etching process. However, the physical etching process requires increased bias power, so selectivity of the photosensitive film is lowered, thereby forming an attack or a slope in the metal wiring.

SUMMARY OF THE INVENTION

Accordingly, the present invention has been made to solve the above-mentioned problems occurring in the prior art, and an object of the present invention is to provide a method for forming a metal wiring, in which an upper metal wiring is formed through a physical etching process instead of a chemical etching process for strongly removing metal by-products and an attack and a slope are prevented from being created in the metal wiring when the physical etching process is carried out.

In order to accomplish this object, there is provided a method for forming a metal wiring, the method comprising the steps of: providing a semiconductor substrate formed with an insulation layer having a conductive plug; forming a metal layer including first Ti/TiN layer, an Al layer, and a second Ti/TiN layer, which are sequentially deposited, on an entire surface of the semiconductor substrate; forming a hard mask layer on the metal layer; forming a photosensitive film pattern having a predetermined shape on the hard mask layer such that the photosensitive film pattern covers at least the conductive plug and a part corresponding to the conductive plug; primarily etching the hard mask layer by using the photosensitive film pattern as a mask; secondarily etching the metal layer by using the photosensitive film pattern and a remaining hard mask layer as an etching mask, thereby forming the metal wiring; and removing the photosensitive film pattern.

According to a preferred embodiment of the present invention, the hard mask layer includes a TEOS layer formed through a PECVD process. In addition, an anti-reflective layer is formed between the hard mask layer and the photosensitive film pattern.

The primary etching step includes a dry-etching step utilizing plasma having activated $CHF_3$ and $CH_4$ gases, and the secondary etching step is carried out utilizing plasma including activated $Cl_2$, $BCl_3$, and $N_2$ gases. The secondary etching step includes an over-etching step for etching a part of the insulation layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
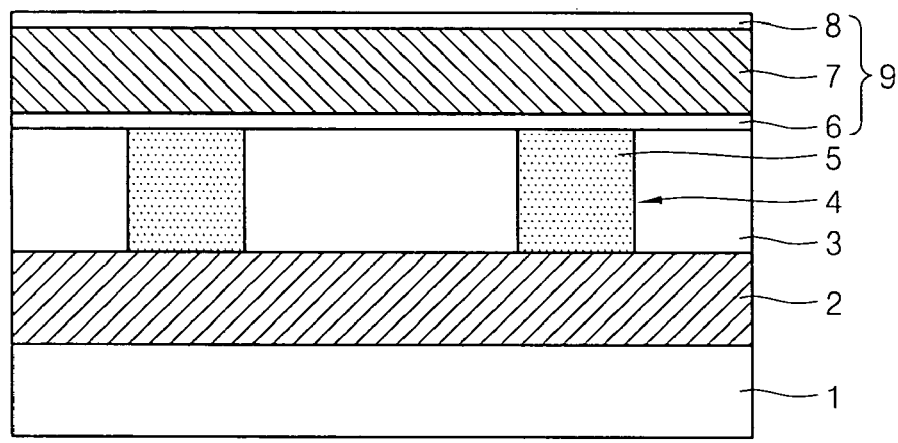
FIGS. 1a to 1c are sectional views showing a conventional method for forming a metal wiring.
Figure 1B:
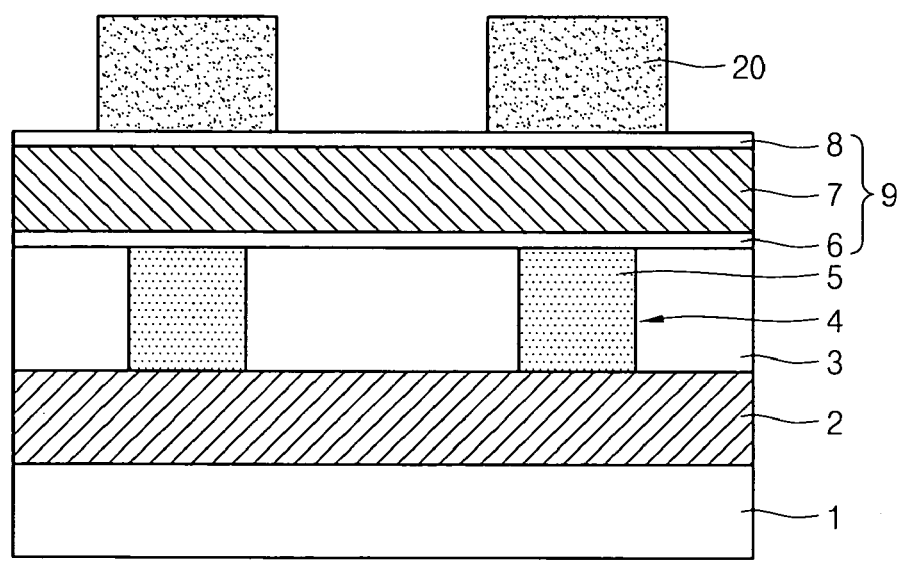
Figure 1C:
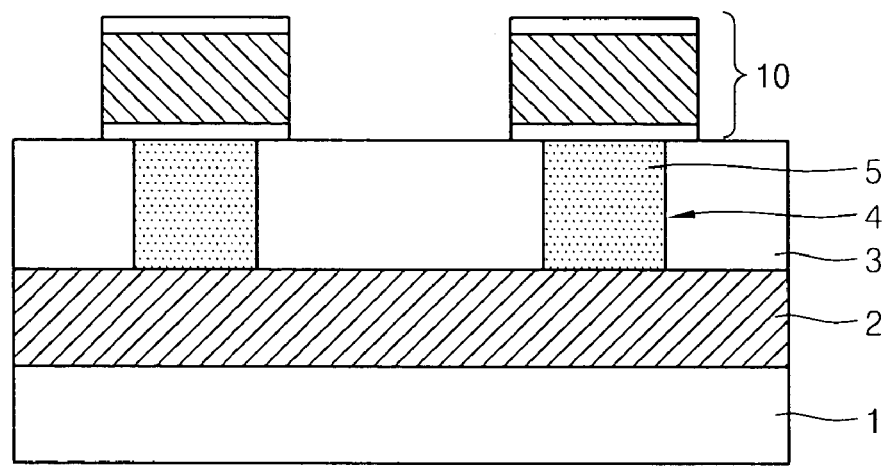
Figure 2:
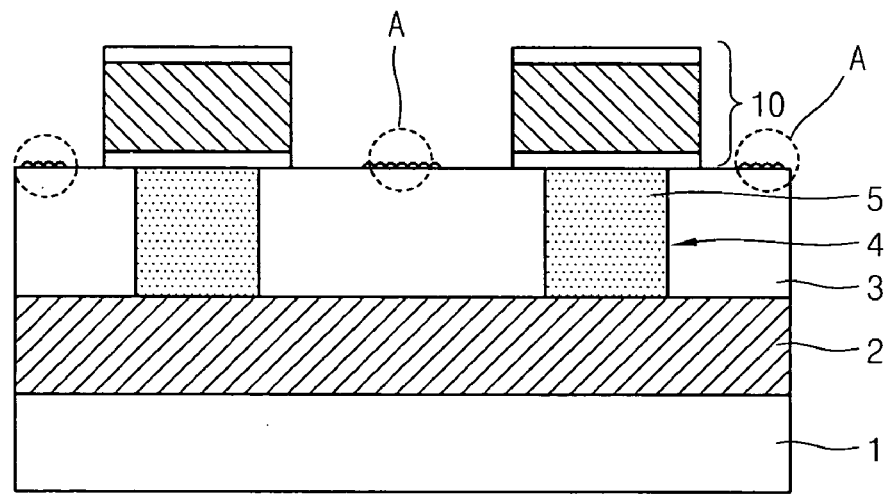
FIG. 2 is a sectional view for explaining problems of conventional method for forming a metal wiring.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 3a to 3d are sectional views showing a method for forming a metal wiring according to one embodiment of the present invention.

Figure 3A:
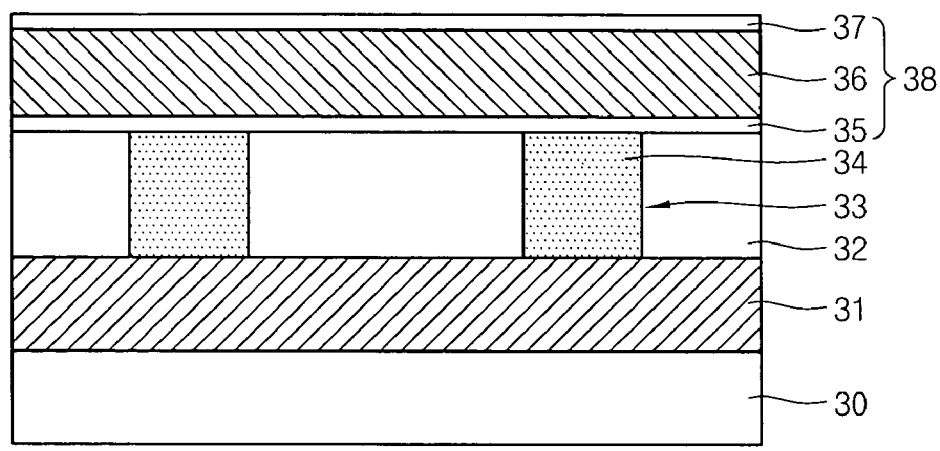
FIGS. 3a to 3d are sectional views showing a method for forming a metal wiring according to one embodiment of the present invention.

As shown in FIG. 3a, a lower metal wiring 31 is formed on a semiconductor substrate 30. Then, an insulation layer 32 is formed on the semiconductor substrate 30. In addition, a contact hole 33 exposing a part of the lower metal wiring 31 is formed in the insulation layer 32 and a conductive plug 34 is provided to fill the contact hole 33.

After that, a metal layer 38 for forming an upper metal wiring and including a first Ti/TiN layer 35, an Al layer 36, and a second Ti/TiN layer 37, which are sequentially deposited, is formed on the entire surface of the semiconductor substrate 30 including the conductive plug 34. At this time, the first and second Ti layers act as an adhesive layer, and the first TiN layer acts as a diffusion barrier. In addition, the Al layer acts as a conductive layer for transferring an electric signal, and the second TiN layer acts as an anti-reflective coating layer for reducing light reflection when patterning the photosensitive film. The above process is substantially identical to the conventional process.

Figure 3B:
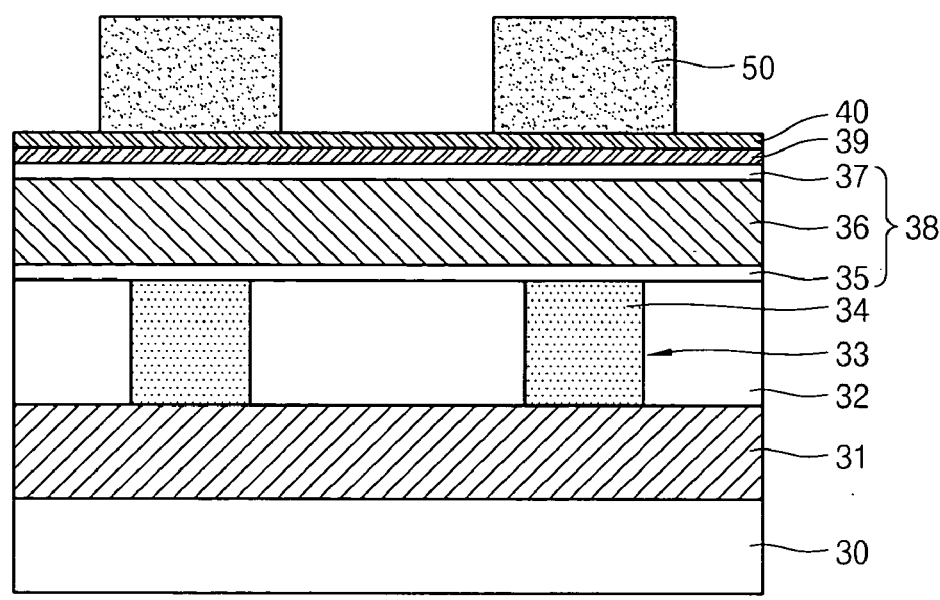

Then, as shown in FIG. 3b, a TEOS (Tetra Ethyl Ortho silicate) layer 39 and an anti-reflective layer 40 are sequentially formed on the metal layer 38 for forming the upper metal wiring. At this time, the TEOS layer 39 is formed though a PECVD (plasma enhanced chemical vapor deposition) process by using reaction energy.

Then, after forming a photosensitive film (not shown) on the anti-reflective layer 40, an exposure and development process is carried out in order to form a photosensitive pattern 50 for exposing an upper metal wiring region (not shown). The TEOS layer 39 is formed before patterning the photosensitive pattern 50, so that the TEOS layer 39 acts as a hard mask for ensuring an etching margin in a next etching process.

Generally, as an integration degree of the metal wirings increases, a line width and an interval between metal wirings are reduced and a height of the metal wiring is increased. Thus, the thickness of the photosensitive film coated on the metal layer must be increased in proportional to the height of the metal wiring. However, according to the present invention, the TEOS layer 39 acts as mask, so it is not required to increase thickness of the photosensitive film coated on the metal layer. Thus, a next etching process can be easily carried out while ensuring the etching margin when performing a metal etching process for forming the upper metal wiring.

The anti-reflective layer 40 is used for preventing a pattern of the upper metal wiring from being distorted during a photo process.

Figure 3C:
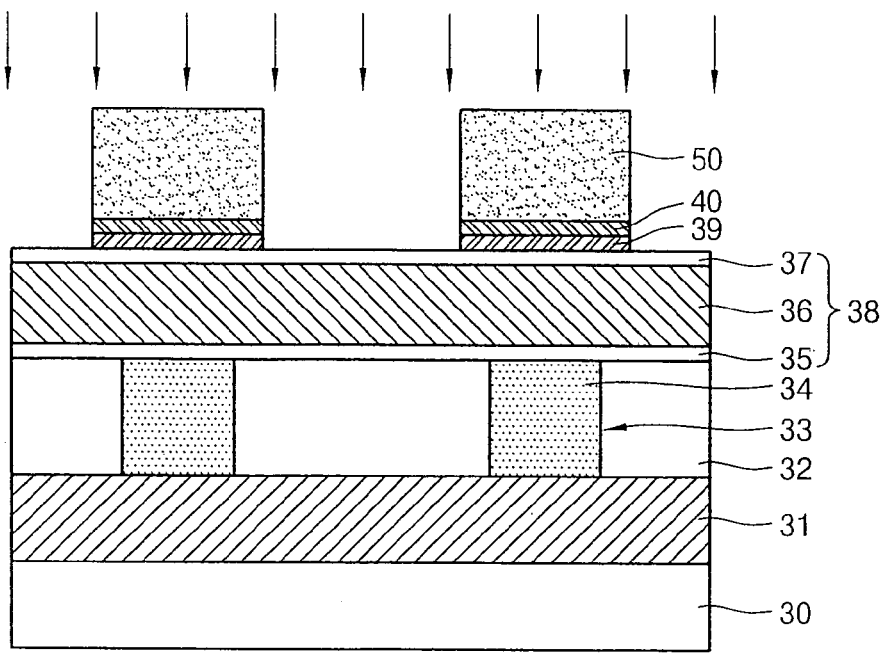

Then, as shown in FIG. 3c, the anti-reflective layer and the TEOS layer are primarily etched by using the photosensitive film pattern as an etching mask. The primary etching process includes a dry-etching process utilizing plasma having activated $CHF_3$ and $CH_4$ gases. Since plasma having activated $CHF_3$ and $CH_4$ gases has a low selectivity with respect to the anti-reflective layer and the TEOS layer, a loss of the photosensitive film pattern is remarkably reduced and the TEOS layer is primarily etched within a short time.

Figure 3D:
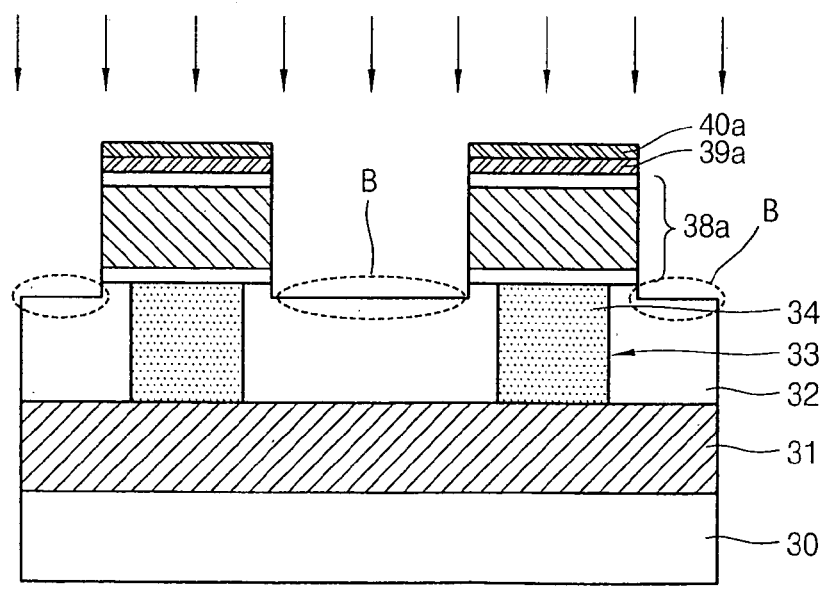

After that, as shown in FIG. 3d, the metal layer for forming the upper metal wiring is secondarily etched by using the photosensitive film pattern and remaining anti-reflective layer/TEOS layers as a mask, thereby forming an upper metal wiring 38a. The secondary etching process includes a dry-etching process utilizing plasma having activated $Cl_2$, $BCl_3$ and $N_2$ gases.

Since the TEOS layer, anti-reflective layer and the photosensitive film pattern act as an etching mask when performing the secondary etching process, it is possible to perform a physical etching process, which strongly removes metal by-products as compared with a chemical etching process. That is, since the physical etching process is carried out with increased bias power, the metal by-products are removed together with a surface of the insulation layer while the physical etching process is being carried out.

According to the present invention, the TEOS layer is formed between the photosensitive film pattern and the metal layer as a hard mask, and the metal layer is plasma-etched by using the TEOS layer as a barrier, so that the margin of the photosensitive film is ensured by means of the TEOS layer and over-etching is sufficiently carried out. Thus, the metal by-products can be removed together with the surface of the insulation layer.

That is, the present invention adopts the physical etching process, which strongly removes metal by-products as compared with the chemical etching process, so that the metal by-products can be completely removed. As mentioned above, the physical etching process is carried out with increased bias power, so the metal by-products are removed together with the surface of the insulation layer while the physical etching process is being carried out. According to the present invention, the margin of the photosensitive film is ensured and the over-etching process is sufficiently carried out, so that a bridge phenomenon is not created between metal wirings.

As described above, according to the present invention, the TEOS layer is formed as a hard mask before the photosensitive film is coated on the metal layer, and the physical etching process is carried out in order to strongly remove metal by-products, so the margin of the photosensitive film is ensured by means of the TEOS layer and over-etching is sufficiently carried out. Thus, the metal by-products can be completely removed and the bridge phenomenon cannot be created between metal wirings.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a metal wiring, the method comprising the steps of:
   i) providing a semiconductor substrate formed with an insulation layer having a conductive plug;
   ii) forming a metal layer including first Ti/TiN layer, an Al layer, and a second Ti/TiN layer, which are sequentially deposited, on an entire surface of the semiconductor substrate;
   iii) successively forming a hard mask layer consisting of a TEOS layer and an anti-reflective layer on the metal layer;
   iv) forming a photosensitive film pattern having a predetermined shape on the anti-reflective layer such that the photosensitive film pattern covers at least the conductive plug and a part corresponding to the conductive plug;
   v) plasma etching the anti-reflective layer and the TEOS layer by using the photosensitive film pattern as a mask, thereby forming a patterned hard mask layer;
   vi) physical etching a portion of the metal layer and a surface of the insulation layer exposed due to the physical etching of the metal layer by using the patterned hard mask layer as an etching mask, thereby forming the metal wiring, wherein the bias power applied in the physical etching step is sufficiently increased to overetch the surface of the insulation layer such that any metal by-product left on the surface of the insulation layer is removed; and
   vii) removing the photosensitive film pattern.

2. The method as claimed in claim 1, wherein the plasma etching step utilizes plasma having activated $CHF_3$ and $CH_4$ gases.

3. The method as claimed in claim 1, wherein the physical etching step is carried out utilizing plasma including activated $Cl_2$, $BCl_3$, and $N_2$ gases.

* * * * *